US010312079B2

(12) United States Patent
Takeya et al.

(10) Patent No.: US 10,312,079 B2
(45) Date of Patent: Jun. 4, 2019

(54) ETCHING METHOD

(71) Applicant: TOKYO ELECTRON LIMITED, Tokyo (JP)

(72) Inventors: Koji Takeya, Yamanashi (JP); Kazuaki Nishimura, Yamanashi (JP); Nobuhiro Takahashi, Yamanashi (JP); Junichiro Matsunaga, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/517,497

(22) PCT Filed: Sep. 25, 2015

(86) PCT No.: PCT/JP2015/077085
§ 371 (c)(1),
(2) Date: Apr. 6, 2017

(87) PCT Pub. No.: WO2016/056401
PCT Pub. Date: Apr. 14, 2016

(65) Prior Publication Data
US 2017/0309478 A1    Oct. 26, 2017

(30) Foreign Application Priority Data
Oct. 9, 2014  (JP) ................. 2014-207714

(51) Int. Cl.
H01L 21/02    (2006.01)
H01L 21/3065  (2006.01)
C23C 16/455   (2006.01)
H01J 37/32    (2006.01)
H01L 21/311   (2006.01)
(Continued)

(52) U.S. Cl.
CPC .. *H01L 21/02381* (2013.01); *C23C 16/45557* (2013.01); *H01J 37/32009* (2013.01); *H01J 37/32357* (2013.01); *H01J 37/32449* (2013.01); *H01L 21/3065* (2013.01); *H01L 21/31116* (2013.01); *H01L 21/32135* (2013.01); *H01L 21/32137* (2013.01); *H01L 21/67069* (2013.01);
(Continued)

(58) Field of Classification Search
None
See application file for complete search history.

(56) References Cited

U.S. PATENT DOCUMENTS

2012/0129354 A1* 5/2012 Luong .................. H01L 21/6831
                                                          438/714
2015/0126039 A1* 5/2015 Korolik ............... H01L 21/3065
                                                          438/718

FOREIGN PATENT DOCUMENTS

JP    2013-225604    10/2013
JP    2013-251471    12/2013
(Continued)

OTHER PUBLICATIONS

International Search Report dated Nov. 24, 2015.

*Primary Examiner* — Jiong-Ping Lu

(57) ABSTRACT

An etching method includes: disposing a target substrate which includes silicon and silicon-germanium in a chamber; supplying the chamber with processing gas which comprises $H_2$ gas and Ar gas in an excited state; and selectively etching the silicon with respect to the silicon-germanium by the processing gas which is in the excited state. Due to this configuration, silicon can be etched, with high selectivity, with respect to the silicon-germanium.

6 Claims, 7 Drawing Sheets

(51) Int. Cl.
*H01L 21/3213* (2006.01)
*H01L 21/67* (2006.01)
*H01L 29/165* (2006.01)
*G05B 19/04* (2006.01)

(52) U.S. Cl.
CPC ............ *H01L 29/165* (2013.01); *G05B 19/04* (2013.01); *G05B 2219/45212* (2013.01)

(56) References Cited

FOREIGN PATENT DOCUMENTS

| | | |
|---|---|---|
| KR | 2004-0030823 A | 4/2004 |
| TW | 200931503 A | 7/2009 |

\* cited by examiner

ETCHING METHOD

CROSS REFERENCE TO RELATED APPLICATIONS

This application is a National Stage Application of, and claims priority to, PCT Application No. PCT/JP2015/077085, filed on Sep. 25, 2015, entitled "Etching Method," which claims priority to Japanese Patent Application No. 2014-207714, filed on Oct. 9, 2014. The foregoing patent applications are herein incorporated by reference by entirety for all purposes.

FIELD OF THE INVENTION

The present invention relates to an etching method for etching silicon (Si) with high selectivity with respect to silicon-germanium (SiGe) formed on a substrate.

BACKGROUND OF THE INVENTION

Recently, in order to meet a demand for high-speed field effect transistor, there is required a technique for forming a laminated structure in which a Si film and a SiGe film are alternately laminated and then performing selective side-etching of the Si film with respect to the SiGe film.

Patent Document 1 discloses therein a technique for performing plasma etching by using, as an etching gas, one or more gases containing carbon atoms, hydrogen atoms and fluorine atoms, e.g., a gaseous mixture of $SF_6$ gas, $H_2$ gas, $CF_4$ gas and Ar gas, while setting a partial pressure of the fluorine atoms to 1.0 Pa or less.

Patent Document 1: Japanese Patent Application Publication No. 2013-251471

However, the technique of Patent Document 1 requires a complicated gas system and a gas needs to contain fluorine that is harmful. Further, since the partial pressure of the fluorine atoms needs to be 1.0 Pa or less, a range of a processing condition to obtain desired selectivity is obtained is narrow.

SUMMARY OF THE INVENTION

In view of the above, the present invention provides a method for etching silicon with high selectivity with respect to silicon-germanium by using a simple gas system and a processing gas that does not contain fluorine without greatly restricting a processing condition.

In accordance with an aspect, there is provided an etching method. First, a target substrate having silicon and silicon-germanium is provided in a chamber. A processing gas containing $H_2$ gas and Ar gas is supplied into the chamber in an excited state. The silicon is selectively etched with respect to the silicon-germanium by the processing gas in the excited state.

The silicon may be a silicon film and the silicon-germanium may be a silicon-germanium film.

During the etching, a pressure in the chamber is preferably within a range from 1.33 Pa to 133 Pa.

During the etching, a temperature of a mounting table on which the target substrate is mounted is preferably within a range from 0 to 80° C.

During the etching, a volume ratio of the $H_2$ gas and the Ar gas is preferably within a range from 1:20 to 20:1.

The $H_2$ gas and the Ar gas may be turned into a plasma outside the chamber and introduced as the plasma into the chamber.

In accordance with another aspect, there is provided a non-transitory storage medium storing a program that operates on a computer and controls an etching apparatus. The program, when executed, causes the computer to control the etching apparatus to perform an etching method. In the method, a target substrate having silicon and silicon-germanium is provided in a chamber, a processing gas containing $H_2$ gas and Ar gas is supplied into the chamber in an excited state, and the silicon is selectively etched with respect to the silicon-germanium by the processing gas in the excited state.

EFFECT OF THE INVENTION

In accordance with the present invention, it is possible to etch silicon with high selectivity with respect to silicon-germanium by using a processing gas that contains $H_2$ gas and Ar gas and does not contain fluorine and a simple gas system without greatly restricting a processing condition.

DETAILED DESCRIPTION OF THE EMBODIMENTS

Hereinafter, embodiments will be described with reference to the accompanying drawings.

Example of Processing System Used in Embodiment of the Present Invention

Figure 1:
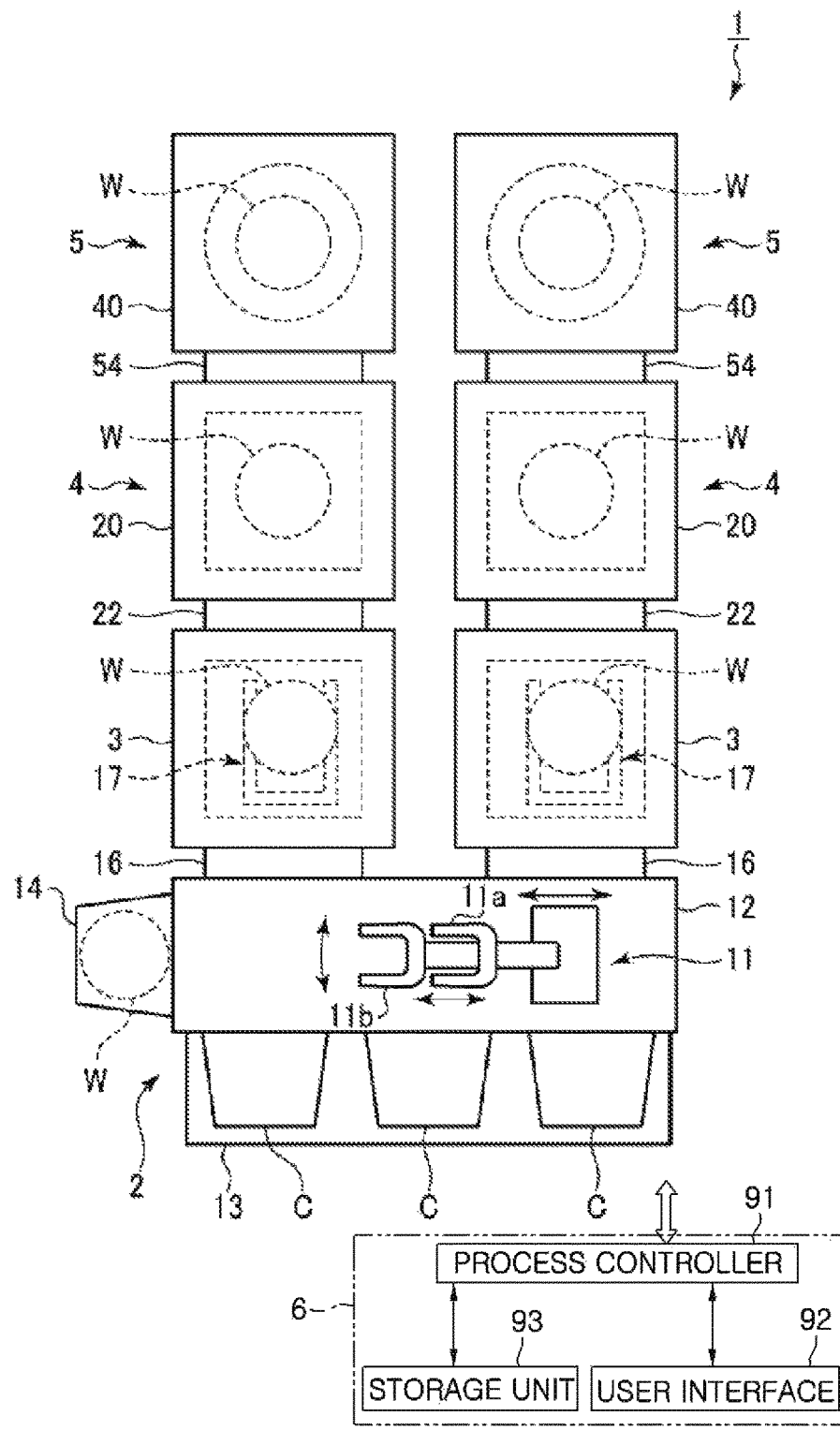
FIG. 1 is a schematic diagram showing an example of a processing system including an etching apparatus used for implementing an etching method according to an embodiment.

FIG. 1 is a schematic diagram showing an example of a processing system including an etching apparatus for performing an etching method according to an embodiment of the present invention. A processing system 1 includes: a loader module 2 for loading/unloading a semiconductor wafer (hereinafter, simply referred to as "wafer") W that is a target substrate; two load-lock chambers (L/L) 3 provided near the loader module 2; heat treatment apparatuses 4, provided near the respective load-lock chambers 3, for performing heat treatment on the wafer W; etching apparatuses 5 according to an embodiment, provided near the respective heat treatment apparatuses 4, for performing etching on the wafer W without generating a plasma in the chamber; and a control unit 6.

The loader module 2 includes a transfer chamber (L/M) 12 where a first wafer transfer unit 11 for transferring a wafer W is provided. The first wafer transfer unit 11 has two transfer arms 11a and 11b for substantially horizontally holding the wafer W. A mounting stage 13 is provided at a longitudinal side of the transfer chamber 12. A plurality of, e.g., three, carriers C, each being capable of accommodating a plurality of wafers W, can be connected to the mounting stage 13. An orienter 14 for performing positioning by rotating the wafer W to optically obtain eccentricity is provided near the transfer chamber 12.

In the loader module 2, the wafer W is held by the transfer arm 11a or 11b. The first wafer transfer unit 11 transfers the wafer W to a desired position by linearly moving the wafer W in a substantially horizontal plane and vertically moving the wafer W. The wafer W is loaded into and unloaded from the carriers C on the mounting stage 13, the orienter 14, and the load-lock chambers 3 by the extension and retraction of the transfer arm 11a or 11b.

Each of the load-lock chambers 3 is connected to the transfer chamber 12 through a gate valve 16 disposed therebetween. A second wafer transfer unit 17 for transferring the wafer W is provided in each of the load-lock chambers 3. The load-lock chambers 3 can be evacuated to a predetermined vacuum level.

The second wafer transfer unit 17 has a multi-joint arm structure and a pick for substantially horizontally holding the wafer W. In the second wafer transfer unit 17, the pick is positioned in the load-lock chamber 3 when the multi-joint arm is retracted. The pick reaches the heat treatment apparatus 4 when the multi-joint arm is extended. The pick can reach the etching apparatus 5 when the multi-joint arm is further extended. Therefore, the wafer W can be transferred between the load-lock chamber 3, the heat treatment apparatus 4 and the etching apparatus 5.

Figure 2:
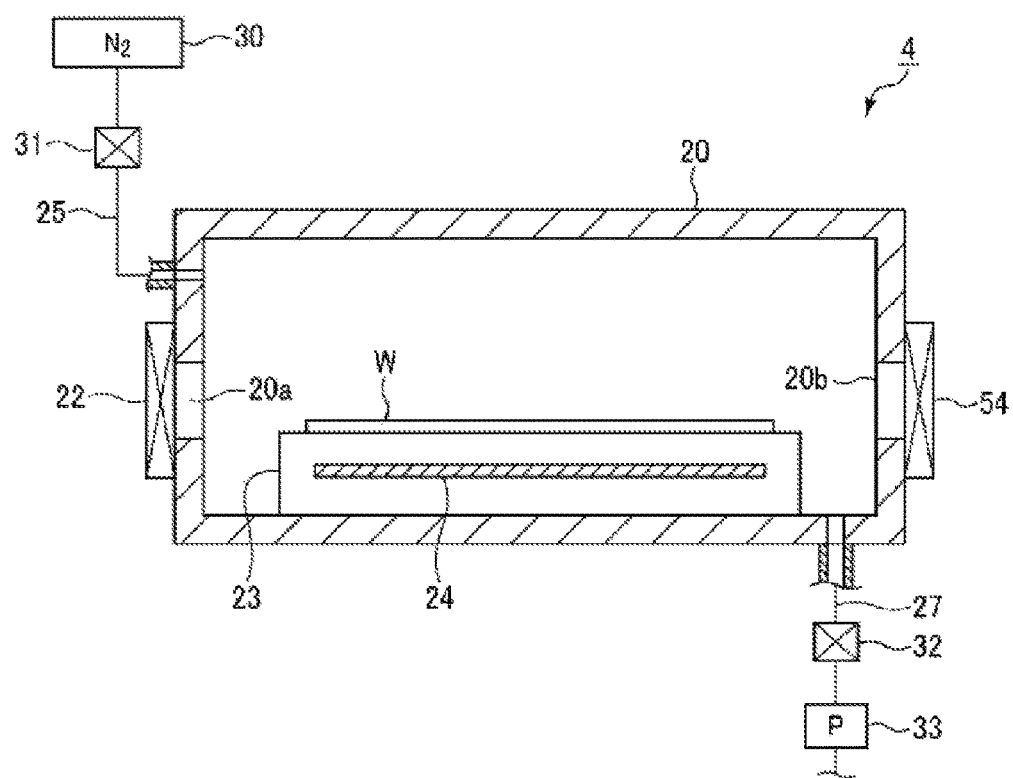
FIG. 2 is a cross sectional view showing a heat treatment apparatus installed in the processing system of FIG. 1.

As shown in FIG. 2, the heat treatment apparatus 4 includes a vacuum evacuable chamber 20 and a mounting table for horizontally mounting thereon the wafer W in the chamber 20. A heater 24 is embedded in the mounting table 23. By heating the wafer W that has been subjected to the etching process by the heater 24, etching residues remaining on the wafer W are sublimated and removed. A loading/unloading port 20a through which the wafer is transferred to and from the load-lock chamber 3 is provided at a side of the chamber 20 which faces the load-lock chamber 3. The loading/unloading port 20a can be opened and closed by a gate valve 22. A loading/unloading port 20b through which the wafer is transferred to and from the etching apparatus 5 is provided at a side of the chamber 20 which faces the etching apparatus 5. The loading/unloading port 20b can be opened and closed by a gate valve 54. A gas supply line 25 is connected to an upper portion of a sidewall of the chamber 20. The gas supply line 25 is connected to an $N_2$ gas supply source 30. A gas exhaust line 27 is connected to a bottom wall of the chamber 20. The gas exhaust line 27 is connected to a vacuum pump 33. A flow rate control valve 31 is provided in the gas supply line 25. A pressure control valve 32 is provided in the gas exhaust line 27. By controlling those valves, an inside of the chamber 20 is set to an $N_2$ gas atmosphere of a predetermined pressure. In that state, the heat treatment is performed. An inert gas such as Ar gas or the like may be used other than $N_2$ gas.

The control unit 90 includes a process controller 91 having a microprocessor (computer) for controlling the respective components of the processing system 1. The process controller 91 is connected to a user interface 92 including a keyboard through which an operator inputs commands to manage the processing system 1, a display for visualizing and displaying an operation state of the processing system 1, and the like. The process controller is also connected to a storage unit 93 which stores control programs, processing recipes, various database and the like. The control programs are used to realize various processes performed in the processing system 1, e.g., the supply of the processing gas in the etching apparatus 5 which will be described later, the exhaust of the chamber and the like, under the control of the process controller. The processing recipes are control programs for allowing the respective components of the processing system 1 to perform predetermined processes based on processing conditions. The processing recipes are stored in an appropriate storage medium (not shown) in the storage unit 93. If necessary, any recipe is read out from the storage unit 93 and executed in the process controller 91. Accordingly, a desired process in the processing system 1 is performed under the control of the process controller 91.

The etching apparatus 5 of the present embodiment etches Si by supplying a processing gas containing $H_2$ gas and Ar gas in an excited state. A specific configuration thereof will be described in detail later.

In the processing system 1, there is used a wafer W including Si to be etched and SiGe. A plurality of such wafers W is transferred to the processing system 1 while being accommodated in a carrier C.

In the processing system 1, in a state where the gate valve 16 of an atmospheric side is opened, a wafer W is transferred from the carrier C of the loader module 2 to the load-lock chamber 3 and then delivered to the pick of the second wafer transfer unit 17 in the load-lock chamber 3 by one of the transfer arms 11a and 11b of the first wafer transfer unit 11.

Next, the load-lock chamber 3 is vacuum-evacuated after closing the gate valve 16 of the atmospheric side. Then, the gate valves 22 and 54 are opened, and the wafer W is transferred to the etching apparatus 5 by extending the pick to the etching apparatus 5.

Thereafter, the pick is returned to the load-lock chamber 3 and the gate valves 22 and 54 are closed. Then, the etching process which will be described later is performed in the etching apparatus 5.

Upon completion of the etching process, the gate valves 22 and 54 are opened, and the etched wafer W is transferred to the heat treatment apparatus 4 by the pick of the second wafer transfer unit 17. Thereafter, the wafer W on the mounting table 23 is heated by the heater 24 while introducing $N_2$ gas into the chamber 20. Accordingly, etching residues and the like are heated and removed.

Upon completion of the heat treatment in the heat treatment apparatus 4, the gate valve 22 is opened and the etched wafer W on the mounting table 23 is retreated to the load-lock chamber 3 by the pick of the second wafer transfer unit 17 and then returned to the carrier C by any one of the transfer arms 11a and 11b of the first wafer transfer unit 11. In this manner, processing of a single wafer is completed.

The processing system 1 does not necessarily include the heat treatment apparatus 4. When the heat treatment apparatus 4 is not provided, the etched wafer W may be retreated to the load-lock chamber 3 by the pick of the second wafer transfer unit 17 and then returned to the carrier C by any one of the transfer arms 11a and 11b of the first wafer transfer unit 11.

Configuration of Etching Apparatus

Hereinafter, the etching apparatus 5 for implementing the etching method of the present embodiment will be described in detail.

Figure 3:
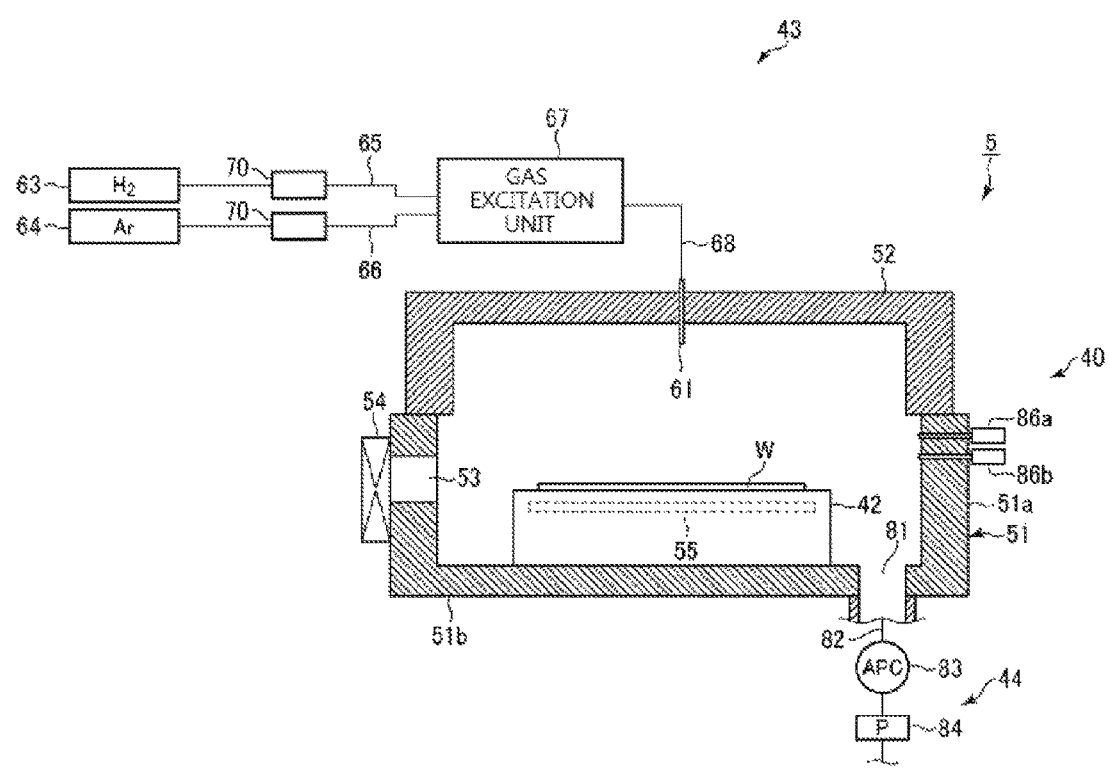
FIG. 3 is a cross sectional view showing the etching apparatus installed in the processing system of FIG. 1.

FIG. 3 is a cross sectional view showing the etching apparatus 5. As shown in FIG. 3, the etching apparatus 5 includes a chamber 40 having an airtight structure. A mounting table 42 for substantially horizontally mounting thereon the wafer W is provided in the chamber 40. The etching apparatus 5 further includes a gas supply unit 43 for supplying an etching gas into the chamber 40, and a gas exhaust unit 44 for exhausting the chamber 40.

The chamber 40 includes a chamber main body 51 and a cover 52. The chamber main body 51 has a substantially cylindrical sidewall 51a and a bottom portion 51b. The chamber main body 51 has an open top, and the open top is blocked by the cover 52. The sidewall 51a and the cover 52 are sealed by a seal member (not shown) and, thus, airtightness in the chamber 40 is ensured. A gas introduction nozzle 61 is inserted from above into the chamber 40 through a ceiling wall of the cover 52.

A loading/unloading port 53 through which the wafer W is transferred to and from the chamber 20 of the heat treatment apparatus 4 is provided at the sidewall 51a. The loading/unloading port 53 can be opened and closed by the gate valve 54.

The mounting table 42 is formed in a substantially circular shape when seen from the top. The mounting table 42 is fixed to the bottom portion 51a of the chamber 40. A temperature controller 55 for controlling a temperature of the mounting plate 42 is provided in the mounting table 42. The temperature controller 55 includes a conduit through which a temperature control medium (e.g., water or the like) circulates. The temperature of the mounting table 42 is controlled by heat exchange with the temperature control medium flowing in the conduit. Accordingly, the temperature of the wafer W on the mounting table 42 is controlled.

The gas supply unit 43 includes an $H_2$ gas supply source 63 for supplying $H_2$ gas and an Ar gas supply source 64 for supplying Ar gas. The gas supply unit 43 further includes: an $H_2$ gas supply line 65 connected to the $H_2$ gas supply source 63; an Ar gas supply line 66 connected to the Ar gas supply source 64; and a gas excitation unit 67, connected to the $H_2$ gas supply line 65 and the Ar gas supply line 66, for exciting $H_2$ gas and Ar gas. An excited gas supply line 68 is connected to the gas excitation unit 67. The excited gas supply line 68 is connected to the aforementioned gas introduction nozzle 61. $H_2$ gas and Ar gas supplied from the $H_2$ gas supply source 63 and the Ar gas supply source 64 to the gas excitation unit 67 through the $H_2$ gas supply line 65 and the Ar gas supply line 66 are excited by the gas excitation unit 67 and the excited gases are introduced into the chamber 40 through the excited gas supply line 68 and the gas introduction nozzle 61.

The configuration of the gas excitation unit 67 is not limited as long as a gas can be excited. However, it is preferable to use a configuration in which a gas is turned into a plasma by an appropriate technique. As for a plasma, a generally used plasma, e.g., an inductively coupled plasma, a capacitively coupled plasma, a microwave plasma or the like, may be used.

Each of the $H_2$ gas supply line 65 and the Ar gas supply line 66 is provided with a flow rate controller 70 for performing an opening/closing operation of flow path and a flow rate control operation. The flow rate controller 70 is configured by, e.g., an opening/closing valve and a mass flow controller.

In addition, a shower plate may be provided at an upper portion of the chamber 40, and an excited gas may be supplied in a shower pattern through the shower plate.

The gas exhaust unit 44 includes a gas exhaust line 82 connected to the gas exhaust port 81 formed at the bottom portion 51b of the chamber 40. The gas exhaust unit 44 further includes an automatic pressure control (APC) valve 83 for controlling a pressure in the chamber 40 and a vacuum pump 84 for exhausting the chamber 40. The APC valve 83 and the vacuum pump 84 are provided in the gas exhaust line 82.

Two capacitance manometers 86a and 86b serving as pressure gauges for measuring a pressure in the chamber 40 are provided at the sidewall of the chamber 40 such that they are inserted into the chamber 40. The capacitance manometer 86a is used to measure a high pressure and the capacitance manometer 86b is used to measure a low pressure. A temperature sensor (not shown) for detecting a temperature of the wafer W is provided near the wafer W mounted on the mounting table 42.

Al is used as a material of the respective components of the etching apparatus 5, such as the chamber 40, the mounting table 42 and the like. Al material forming the chamber 40 may be pure Al material or Al material of an anodically oxidized inner surface (inner surface of the chamber main body 51 or the like). On the other hand, a surface of Al material forming the mounting table 42 requires wear resistance. Therefore, it is preferable to form an oxide coating ($Al_2O_3$) having high wear resistance on the surface of the Al material by anodically oxidizing the Al material.

Etching Method Using Etching Apparatus

The following is description on an etching method using the etching apparatus configured as described above.

Figure 4A:
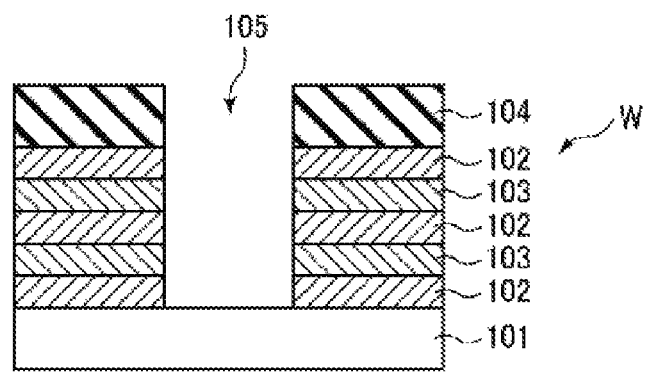
FIG. 4A is a cross sectional view showing an example of a device structure to which the present invention is applied.
Figure 4B:
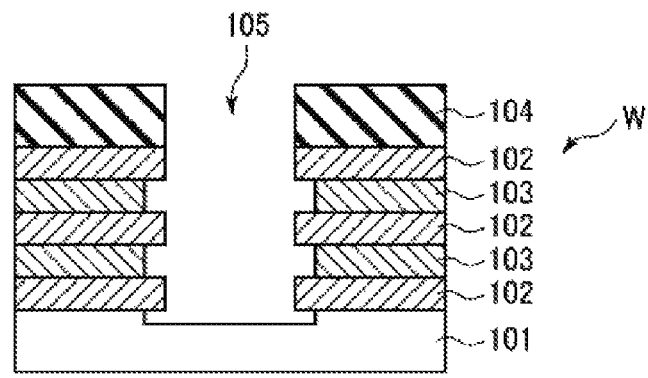
FIG. 4B is a cross sectional view for explaining an etching state of the device structure to which the present invention is applied.

Selective etching of Si is applied to, e.g., a device having a structure shown in FIG. 4A. In other words, there is provided a wafer W having a device structure in which an SiGe film 102 and an Si film 103 are alternately laminated on an Si base 101 and a trench 105 is formed by etching the SiGe film 102 and the Si film 103 while using as an etching mask a hard mask layer 104, e.g., an $SiO_2$ film or the like, formed on the laminated films. The Si films 103 are side-etched by performing the etching method of the present embodiment on the above device structure, as can be seen from FIG. 4B.

The Si film 103 and the SiGe film 102 can be formed by a CVD method of an epitaxial growth method.

In performing the etching method of the present embodiment, in a state where the gate valve 54 of the etching apparatus 5 is opened, the wafer W having the device structure shown in FIG. 4A, for example, is loaded into the chamber 40 and mounted on the mounting table 42 by the pick of the second wafer transfer unit 17 in the load-lock chamber 3.

Then, the pick is returned to the load-lock chamber 3 and the gate valve 54 is closed to maintain the chamber 40 in a sealed state.

Next, $H_2$ gas and Ar gas are excited and introduced into the chamber 40, and the Si films 103 formed on the wafer W are side-etched.

Specifically, a temperature of the mounting table 42 is controlled to be within a predetermined range by the temperature controller 55, and a pressure in the chamber 40 is controlled to be within a predetermined range. H₂ gas and Ar gas respectively supplied from the H₂ gas supply source 63 and the Ar gas supply source 64 of the gas supply unit 43 are guided to the gas excitation unit 67 through the H₂ gas supply line 65 and the Ar gas supply line 66. The gases excited therein are introduced into the chamber 40 through the excited gas supply line 68 and the gas introduction nozzle 61, thereby performing the side etching of the Si film.

By introducing the processing gas containing H₂ gas and Ar gas into the chamber 40 in an excited state, the Si film can be etched with high selectivity with respect to the SiGe film. By adjusting the condition, an extremely high etching selectivity of 50 or more can be obtained.

Hereinafter, circumstances that have led to the gas system will be described.

Conventionally, HF gas was used in etching Si. The selective etching of the Si film with respect to the SiGe film using HF gas was examined. A processing gas containing a mixture of HF gas, H₂ gas, and Ar gas as a dilution gas was used instead of HF gas due to its extremely high reactivity. The Si film and the SiGe film were etched by supplying a plasma of the processing gas into the chamber. As a result, the Si film was etched at a high etching rate. However, the SiGe film was also etched and, thus, the etching selectivity of the Si film with respect to the SiGe film was low. When the same etching was performed by using a plasma of H₂ gas and Ar gas while setting a flow rate of HF gas to zero, the etching amount of the Si film was reduced. However, the SiGe film was hardly etched. Accordingly, the etching selectivity of the Si film with respect to the SiGe film was extremely high.

Figure 5:
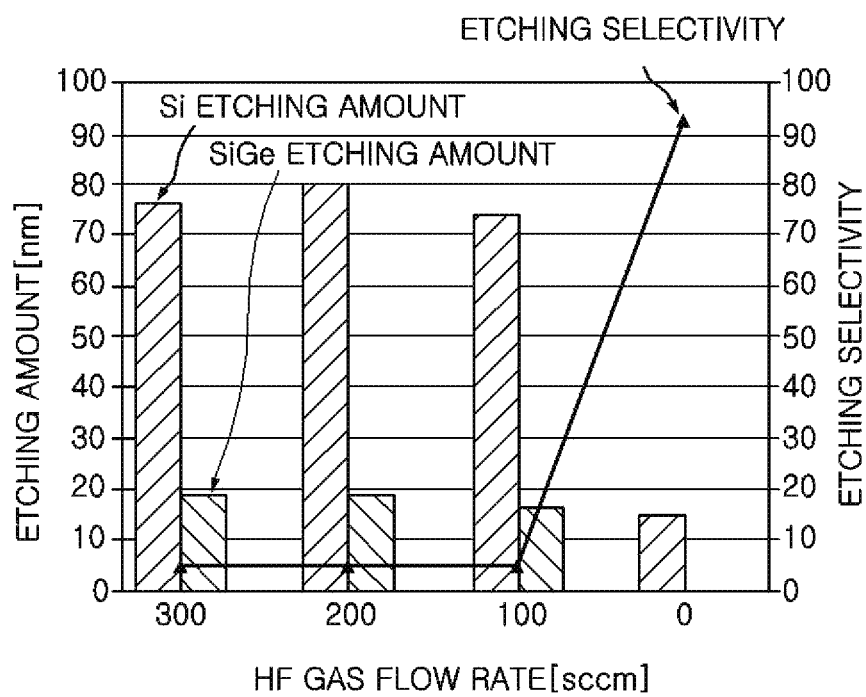
FIGS. 5 and 6 show test results for explaining circumstances that have led to a gas system used in the present invention.

FIG. 5 shows a test result from which the above conclusion is drawn.

Here, a blanket wafer having an Si film and a blanket wafer having an SiGe film were prepared, and the Si film and the SiGe film were etched under a basic condition of a H₂ gas flow rate of 370 sccm, an Ar gas flow rate of 400 sccm, a temperature of 25° C., a pressure of 100 mTorr (13.3 Pa), a plasma generation power (IPC plasma) of 600 W, and processing time of 1 min while varying a flow rate of HF gas to 0 sccm, 100 sccm, 200 sccm, and 300 sccm. As can be seen from FIG. 5, when HF was added, the etching amount of the Si film was 80 nm. Since, however, the SiGe film was also etched by about 20 nm, the etching selectivity of the Si film with respect to the SiGe film was about 4, which is low. On the other hand, when only H₂ gas and Ar gas were used, the etching amount of the Si film was about 15 nm. However, the etching selectivity of the Si film with respect to the SiGe film was increased up to about 93.

Therefore, in order to examine the effect of H₂ gas, the Si film and the SiGe film were etched by using a plasma of H₂ gas. As a result, both of the Si film and the SiGe film were hardly etched.

Next, in order to examine combination of H₂ gas and another gas, the Si film and the SiGe film were etched by using a plasma of H₂ gas and N₂ gas. As a result, the etching amount of the SiGe film was greater than that of Si film.

Figure 6:
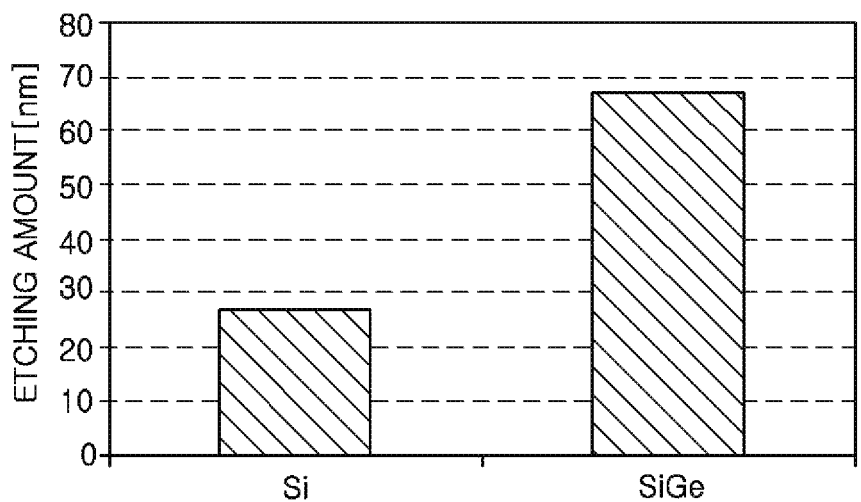

FIG. 6 shows a test result from which the above conclusion is drawn.

Here, the Si film and the SiGe film were etched under a condition of a H₂ gas flow rate of 370 sccm, an N₂ gas flow rate of 100 sccm, a temperature of 25° C., a pressure of 100 mTorr (13.3 Pa), a plasma generation power (IPC plasma) of 600 W, and processing time of 1 min. As can be seen from FIG. 6, when the etching was performed by using combination of H₂ gas and N₂ gas, the etching amount of the Si film was 26.5 nm and that of the SiGe film was 66.7 nm. In other words, the etching amount of the SiGe film was greater than that of the Si film.

As described above, in order to etch the Si film with high selectivity with respect to the SiGe film, it is effective to use excited H₂ gas. In the case of using only H₂ gas, both of the Si film and the SiGe film were not etched. In the case of using a mixture of H₂ gas and N₂ gas, the SiGe film was etched. In the case of using an excited mixture of H₂ gas and Ar gas, it was possible to etch Si film with high selectivity with respect to SiGe film.

In selective etching of the Si film with the SiGe film, it is required to increase the selectivity of the Si film rather than the etching rate. Therefore, it is effective to use the technique of the present embodiment which excites a processing gas containing H₂ gas and Ar gas.

In this etching process, a pressure in the chamber 40 is preferably within a range from 1.33 Pa to 133 Pa (10 mTorr to 1000 mTorr) and more preferably within a range from 6.66 Pa to 66.6 Pa (50 mTorr to 500 mTorr). A temperature of the mounting table 42 (substantially the temperature of the wafer) is preferably within a range from 0° C. to 80° C. and more preferably within a range from 10° C. to 40° C.

A volume ratio (flow rate ratio) of H₂ gas and Ar gas is preferably within a range from 1:20 to 20:1 and more preferably within a range from 1:10 to 10:1.

Upon completion of the etching process in the etching apparatus 5, the gate valve 54 is opened and the etched wafer W on the mounting table 42 is unloaded from the chamber 40 by the pick of the second wafer transfer unit 17.

As described above, in the present embodiment, it is possible to etch the silicon film with high selectivity with respect to the silicon-germanium film by using a simple gas system and a processing gas that does not contain fluorine without greatly restricting the processing condition.

TEST EXAMPLES

Hereinafter, test examples will be described.

Test Example 1

Here, a blanket wafer having an Si film and a blanket wafer having an SiGe film were prepared, and the Si film and the SiGe film were etched under a basic condition of a H₂ gas flow rate of 370 sccm, a temperature of 25° C., a pressure of 100 mTorr (13.3 Pa), a plasma generation power (IPC plasma) of 600 W, and processing time of 3 min while varying an Ar gas flow rate to 50 sccm, 100 sccm, and 400 sccm.

Figure 7:
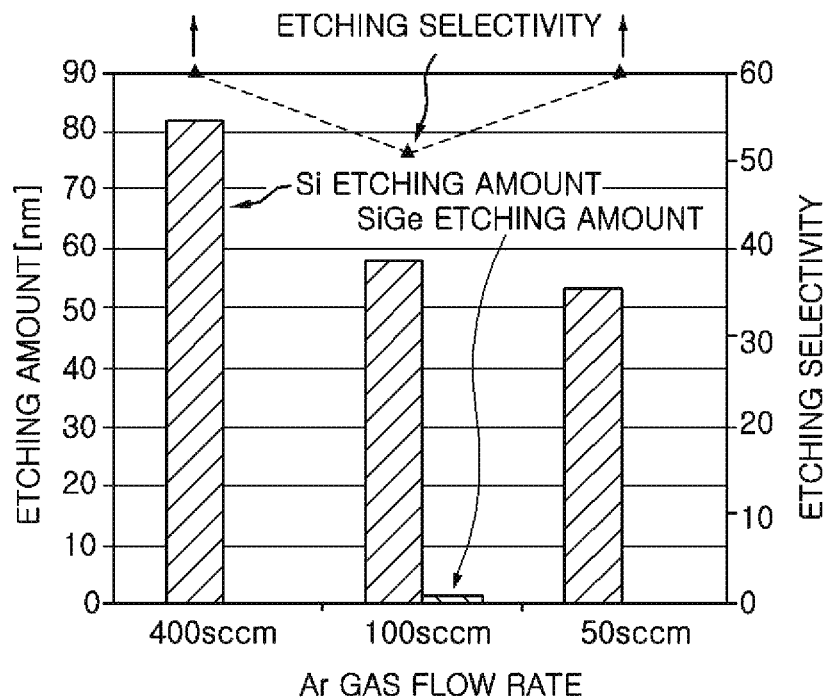
FIG. 7 shows an etching amount of an Si film and an etching selectivity of the Si film with respect to an SiGe film in the case of varying an Ar gas flow rate.

FIG. 7 shows a result thereof. FIG. 7 shows an etching amount of the Si film and an etching selectivity of the Si film with respect to the SiGe film in the respective Ar gas flow rates. As can be seen from FIG. 7, the etching amount of the Si film tends to be increased as the Ar gas flow rate is increased. On the other hand, the SiGe film was hardly etched. The etching amount of the SiGe film was 1.1 nm at the Ar gas flow rate of 100 sccm and zero at the Ar gas flow rates of 50 sccm and 400 sccm. Therefore, the etching selectivity of the Si film with respect to the SiGe film was 51 at the Ar gas flow rate of 100 sccm and infinite at the Ar gas flow rates of 50 sccm and 400 sccm, which was extremely high at any Ar gas flow rate.

Test Example 2

Here, as in the test example 1, a blanket wafer having an Si film and a blanket wafer having an SiGe film were prepared, and the Si film and the SiGe film were etched under a basic condition of a $H_2$ gas flow rate of 370 sccm, an Ar gas flow rate of 100 sccm, a temperature of 25° C., plasma generation power (IPC plasma) of 600 W, and processing time of 3 min while varying a pressure to 100 mTorr (13.3 Pa) and 200 mTorr (26.6 Pa).

Figure 8:
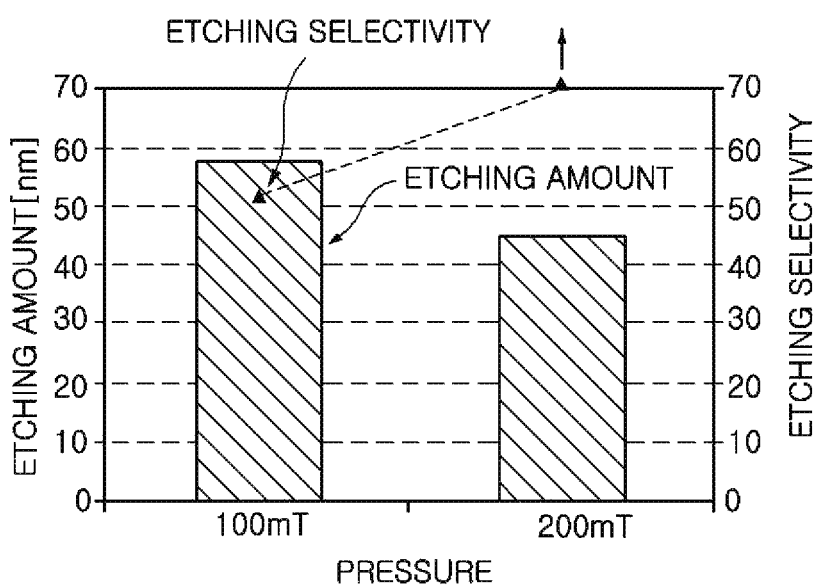
FIG. 8 shows an etching amount of the Si film and an etching selectivity of the Si film with respect to the SiGe film in the case of varying a pressure.

FIG. 8 shows a result thereof. FIG. 8 shows an etching amount of the Si film and an etching selectivity of the Si film with respect to the SiGe film at the respective pressures. As can be seen from FIG. 8, the etching amount of the Si film tends to be increased as the pressure is decreased. On the other hand, the SiGe film was hardly etched. The etching amount of the SiGe film was 1.1 nm at the pressure of 100 mTorr (13.3 Pa) and zero at the pressure of 200 mTorr (26.6 Pa). Therefore, the etching selectivity of the Si film with respect to the SiGe film was 51 at the pressure of 100 mTorr (13.3 Pa) and infinite at the pressure of 200 mTorr (26.6 Pa), which was extremely high at any pressure.

Test Example 3

Here, as in the test example 1, a blanket wafer having an Si film and a blanket wafer having an SiGe film were prepared and the Si film and the SiGe film were etched under a basic condition of a $H_2$ gas flow rate of 370 sccm, an Ar gas flow rate of 400 sccm, a temperature of 25° C., and a plasma generation power (IPC plasma) of 600 W while varying etching time to 1 min and 3 min.

Figure 9:
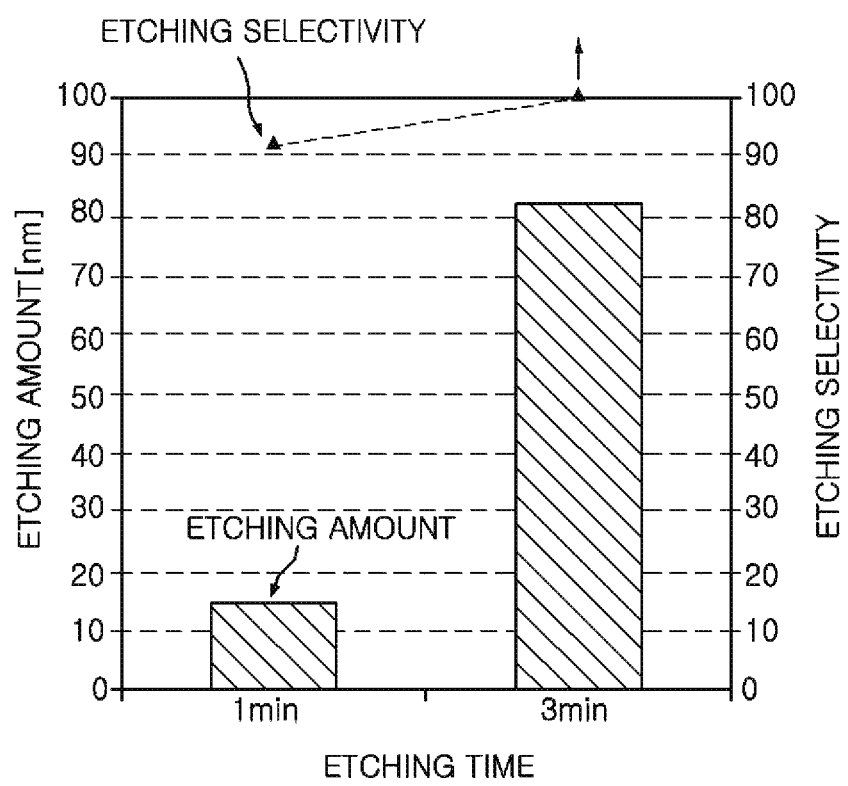
FIG. 9 shows an etching amount of the Si film and an etching selectivity of the Si film with respect to the SiGe film in the case of varying an etching time.

FIG. 9 shows a result thereof. FIG. 9 shows an etching amount of the Si film and an etching selectivity of the Si film with respect to the SiGe film at the respective etching times. As can be seen from FIG. 9, the etching amount of the Si film is increased as the etching time is increased. However, the SiGe film is hardly etched regardless of the etching time. The etching amount of the SiGe film was 0.16 nm at the etching time of 1 min and 0 nm at the etching time of 3 min. The etching selectivity of the Si film with respect to the SiGe film was 93 and infinite at the etching time of 1 min and 3 min, respectively. In other words, the high selectivity was obtained regardless of the etching time.

Other Applications of the Present Invention

The present invention can be variously modified without being limited to the above embodiment. For example, the apparatus of the above embodiment is merely an example, and the etching method of the present invention can also be performed by other apparatuses of various configurations. Although an example in which an Si film is used as Si and an SiGe film is used as SiGe has been described, a semiconductor wafer (semiconductor substrate) having as a base any one of Si and SiGe may be used. Further, although the case of using a semiconductor wafer as a target substrate has been described, the target substrate is not limited to the semiconductor wafer and may be another substrate such as an FPD (flat-panel display) substrate represented by a substrate for LCD (liquid crystal display) monitor, a ceramic substrate or the like.

DESCRIPTION OF REFERENCE NUMERALS

1; processing system, 2; loader module, 3; load-lock chamber, 5; etching apparatus, 6; control unit, 11; first wafer transfer unit, 17; second wafer transfer unit, 40; chamber, 43; gas supply unit, 44; gas exhaust unit, 61; gas introduction nozzle, 63; $H_2$ gas supply source, 64; Ar gas supply source, 65; $H_2$ gas supply line, 66: Ar gas supply line, 67; gas excitation unit, 68; excited gas supply line, W; semiconductor wafer

What is claimed is:

1. An etching method comprising: providing a target substrate having silicon and silicon-germanium in a chamber; supplying a processing gas containing $H_2$ gas and Ar gas into the chamber in an excited state, the processing gas being devoid of species comprising halogen; and selectively etching the silicon with respect to the silicon-germanium by the processing gas in the excited state.

2. The etching method of claim 1, wherein the silicon is a silicon film and the silicon-germanium is a silicon-germanium film.

3. The etching method of claim 1, wherein during the etching, a pressure in the chamber is within a range from 1.33 Pa to 133 Pa.

4. The etching method of claim 1, wherein during the etching, a temperature of a mounting table on which the target substrate is mounted is within a range from 0 to 80° C.

5. The etching method of claim 1, wherein during the etching, a volume ratio of the $H_2$ gas and the Ar gas is within a range from 1:20 to 20:1.

6. The etching method of claim 1, wherein the $H_2$ gas and the Ar gas are turned into a plasma outside the chamber and introduced as the plasma into the chamber.

* * * * *